United States Patent
Hayakawa et al.

(10) Patent No.: US 8,743,593 B2
(45) Date of Patent: Jun. 3, 2014

(54) MAGNETORESISTANCE EFFECT ELEMENT AND MAGNETIC MEMORY CELL AND MAGNETIC RANDOM ACCESS MEMORY USING SAME

(75) Inventors: Jun Hayakawa, Hino (JP); Hiromasa Takahashi, Cambridge (GB)

(73) Assignee: Hitachi, Ltd., Tokyo (JP)

( * ) Notice: Subject to any disclaimer, the term of this patent is extended or adjusted under 35 U.S.C. 154(b) by 338 days.

(21) Appl. No.: 13/133,177

(22) PCT Filed: Nov. 16, 2009

(86) PCT No.: PCT/JP2009/006122
§ 371 (c)(1),
(2), (4) Date: Jun. 7, 2011

(87) PCT Pub. No.: WO2010/067520
PCT Pub. Date: Jun. 17, 2010

(65) Prior Publication Data
US 2011/0233700 A1 Sep. 29, 2011

(30) Foreign Application Priority Data
Dec. 10, 2008 (JP) ................................ 2008-314551

(51) Int. Cl.
*G11C 11/00* (2006.01)

(52) U.S. Cl.
USPC .......................................... 365/158; 365/148

(58) Field of Classification Search
USPC ........................................................ 365/158
See application file for complete search history.

(56) References Cited

U.S. PATENT DOCUMENTS

| 5,695,864 A | 12/1997 | Slonczewski |
| 7,663,171 B2 | 2/2010 | Inokuchi et al. |
| 2002/0105827 A1 | 8/2002 | Redon et al. |
| 2005/0185459 A1 | 8/2005 | Fukuzumi |
| 2005/0219767 A1 | 10/2005 | Nakamura et al. |

(Continued)

FOREIGN PATENT DOCUMENTS

| JP | 2002-305337 A | 10/2002 |
| JP | 2004-349671 A | 12/2004 |

(Continued)

OTHER PUBLICATIONS

T. Miyazaki et al., Giant magnetic tunneling effect in Fe/Al2O3/Fe junction, Journal of Magnetism and Magnetic Materials, 139, pp. L231-L234, 1995.

(Continued)

*Primary Examiner* — Harry W Byrne
(74) *Attorney, Agent, or Firm* — Mattingly & Malur, PC

(57) ABSTRACT

Disclosed are a magnetoresistance effect element equipped with an magnesium oxide passivation layer, and a high-speed, ultra-low power consumption nonvolatile memory using said element. A tunnel magnetoresistance effect (TMR) film comprised of a ferromagnetic free layer, an insulation layer, and a ferromagnetic fixed layer is provided, and an MgO passivation layer is provided on the side walls of a protective layer and an orientation control layer, thus suppressing elemental diffusion of a tunnel magnetoresistance effect (TMR) element from each layer due to thermal processing at 350° or higher and obtaining a magnetic memory cell and magnetic random access memory having stable, high-output reading and a low current writing characteristics. Furthermore, when CoFeB is used in the ferromagnetic layer and MgO is used in the insulation layer, it is preferable that the MgO passivation layer have an (001) orientation.

17 Claims, 7 Drawing Sheets

(56) References Cited

U.S. PATENT DOCUMENTS

| | | |
|---|---|---|
| 2006/0227465 A1 | 10/2006 | Inokuchi et al. |
| 2007/0025029 A1 | 2/2007 | Hayakawa et al. |
| 2007/0253118 A1 | 11/2007 | Hayakawa et al. |
| 2007/0258170 A1* | 11/2007 | Yuasa .................. 360/324.2 |
| 2008/0180859 A1 | 7/2008 | Ueda et al. |
| 2009/0091863 A1 | 4/2009 | Hosotani et al. |

FOREIGN PATENT DOCUMENTS

| | | |
|---|---|---|
| JP | 2005-294376 A | 10/2005 |
| JP | 2006-269530 A | 10/2006 |
| JP | 2007-59879 A | 3/2007 |
| JP | 2007-2947347 A | 11/2007 |
| JP | 2008-186861 A | 8/2008 |
| JP | 2009-94104 A | 4/2009 |

OTHER PUBLICATIONS

S. Yuasa et al., Giant room-temperature magnetoresistance in single-crystal Fe/MgO/Fe Magnetic tunnel junctions, Nature Materials, vol. 3, pp. 868-871, Dec. 2004.

Japanese Office Action received in Japanese Application No. 2010-541978 dated Apr. 23, 2013.

* cited by examiner

FIG. 11

TABLE $(Co_x Fe_{1-x})_{1-y} B_y$
($0 \leqq x \leqq 100$, $0 \leqq y \leqq 30$)
(CONTAINING CoB, FeB)

$(Ni_x Fe_{1-x})_{1-y} B_y$
($0 \leqq x \leqq 100$, $0 \leqq y \leqq 30$)
(CONTAINING NiB, FeB)

$(Co_x Ni_z Fe_{1-x-z})_{1-y} B_y$
($0 \leqq x \leqq 100$, $0 \leqq y \leqq 30$, $0 \leqq z \leqq 100$)

MAGNETORESISTANCE EFFECT ELEMENT AND MAGNETIC MEMORY CELL AND MAGNETIC RANDOM ACCESS MEMORY USING SAME

TECHNICAL FIELD

The present invention concerns a tunnel magnetoresistance element, and a low power consumption non-volatile magnetic memory provided with the same.

BACKGROUND ART

As tunnel magnetoresistance effect (hereinafter referred to as TMR) elements applied to highly integrated magnetic memories in the feature, a TMR element using Al oxide for an insulation layer (Non Patent Literature 1) and a TMR element using magnesium oxide (MgO) for an insulation layer capable of providing a magnetoresistance ratio several times as high as that (Non Patent Literature 2) have been known. Further, a TMR element using CoFe for the magnetic layer and a low power consumption magnetic memory cell and a magnetic random access memory using the same are disclosed in Patent Literature 1. Further, Patent Literature 2 discloses a TMR element using a magnetic pinned layer of a body-centered cubic lattice typically exemplified by CoFeB and a (100) oriented MgO barrier layer, and a magnetic memory cell and a magnetic random access memory using the same. Further, existent non-volatile magnetic memory comprises a memory cell in which a TMR element is formed over an MOSFET. In the switching, information is written by rotating the magnetization direction of a TMR element using a spatial magnetic field induced by a current generated by supplying a current to bit lines and word lines utilizing an MOSFET and the information is read out by the output voltage of the TMR element.

Further, in addition to the magnetization rotation using the current-induced spatial magnetic field, a so-called magnetization reversal by a spin transfer torque of rotating magnetization by flowing a current directly to a magnetoresistance effect element, in other words, a spin injection magnetization reversal system is known and disclosed, for example, in Patent literature 6 or Patent literature 3. A patent literature 4 discloses a TMR element of applying a free layer formed by stacking plural ferromagnetic layers by way of a non-magnetic layer with an aim of stably conducting magnetization reversal by a spin transfer torque to a magnetic field invading from the outside. Further, Patent Literature 5 discloses an example of applying an insulation film to the side wall of a TMR element with an aim of improving the reliability of a magnetic memory.

CITATION LIST

Non Patent Literatures

Non Patent Literature 1: T. Miyazaki and N. Tezuka, J. Magn. Magn. Mater, 139, L231 (1995)
Non Patent literature 2: S. Yuasa, et al., Nature Material 3, 868(2004).

Patent Literatures

Patent Literature 1: JP-A-2006-269530
Patent Literature 2: JP-A-2007-59879
Patent Literature 3: JP-A-2002-305337
Patent Literature 4: JP-A-2005-294376
Patent Literature 5: JP-A-2004-349671
Patent Literature 6: U.S. Pat. No. 5,695,864

SUMMARY OF INVENTION

Technical Problem

For attaining a low power consumption non-volatile magnetic memory having high reliability, it is necessary to develop a technique for a magnetoresistance effect element capable of satisfying a high heat stability and a low current writing system by magnetization reversal by a spin transfer torque simultaneously in a free layer (recording layer) of a high output TMR element and capable of withstanding a heat treatment at 350° C. or higher. However, in a TMR element, since elements contained in each of layers as the constituents thereof are diffused by the heat treatment and, particularly, elemental diffusion occurs as far as to the interlayer insulation layer formed on the side wall of the TMR element for flowing a current uniformly in the direction perpendicular to the film surface of the TMR element to deteriorate the voltage withstanding of the interlayer insulation layer. Therefore, it is necessary to form a layer capable of suppressing elemental diffusion due to the heat treatment between the magnetoresistance effect element and the interlayer insulating layer.

Further, when CoFeB is used for the magnetic layer and MgO is used for the insulating layer of the TMR element, CoFeB which was amorphous during film deposition is crystallized by a heat treatment at 320° C. or higher. Accordingly, it is necessary to provide a layer capable of suppressing elemental diffusion due to the heat treatment and promoting uniformity of crystallization of CoFeB.

An object of the present invention is to provide a magnetoresistance effect element capable of satisfying a high heat stability and a low power writing system and capable of withstanding a heat treatment at a predetermined level or higher.

Solution to Problem

For addressing the purpose described above, a magnetoresistance effect element of the present invention includes; an amorphous non-magnetic metal layer, an orientation control layer formed over the non-magnetic metal layer, a TMR element formed above the orientation control layer and comprising a ferromagnetic free layer, a ferromagnetic pinned layer, and an insulation layer formed between the ferromagnetic free layer and the ferromagnetic pinned layer, a magnesium oxide passivation layer for covering the side wall of the tunnel magnetoresistance effect element, the side wall of the orientation control layer, and the side wall and the surface of the non-magnetic metal layer, an interlayer insulation layer for covering the magnesium oxide passivation layer, and a pair of electrode layers for flowing a current in a direction perpendicular to the film surface of the TMR element.

That is, in the configuration of the present invention, elemental diffusion is suppressed by covering the side wall of the TMR element with the MgO passivation layer, thereby suppressing the deterioration of electric characteristics of the interlayer insulating layer. Further, in a preferred configuration of the present invention, by subjecting the MgO passivation layer to (001) orientation, the crystal uniformity of CoFeB of the TMR element that crystallizes at 320° C. or higher can be improved to obtain the best effect of the TMR.

The TMR element of the present invention is applicable to a magnetic memory cell or a magnetic random access memory.

Advantageous Effects of Invention

According to an aspect of the present invention, even when a heat treatment at 350° C. is performed, the ferromagnetic layer of the magnetoresistance effect element can be crystallized uniformly without deteriorating the voltage withstanding of the interlayer insulating layer thereby obtaining the best TMR effect. By mounting the TMR element to a magnetic memory, it is possible to provide a magnetic memory cell and a magnetic random access memory ensuring rewriting durability for infinite times and non-volatility.

BRIEF DESCRIPTION OF DRAWINGS

FIG. 11 is a table showing materials that can be used for a ferromagnetic pinned layer and a ferromagnetic free layer of the TMR element according to the first embodiment.

DESCRIPTION OF EMBODIMENTS

Embodiments of the invention are to be described with reference to the drawings. In the TMR element to be described below, magnetization reversal (switching) of the ferromagnetic free layer thereof is performed not by a spatial external magnetic field but mainly by providing a torque to the magnetic moment of a ferromagnetic free layer by the spin of a spin-polarized current flowing in the TMR element. The spin-polarized current is generated just by flowing a current to the TMR element. Accordingly, magnetization reversal by spin transfer torque is attained by flowing a current from the outside to the TMR element. A read current which is supplied for reading the magnetization direction of the ferromagnetic free layer of the TMR element is set smaller than a write current for causing magnetic reversal. In the following, the threshold value of a current density at which magnetization reversal by spin transfer torque occurs is defined as Jc.

Embodiment 1

Figure 1:
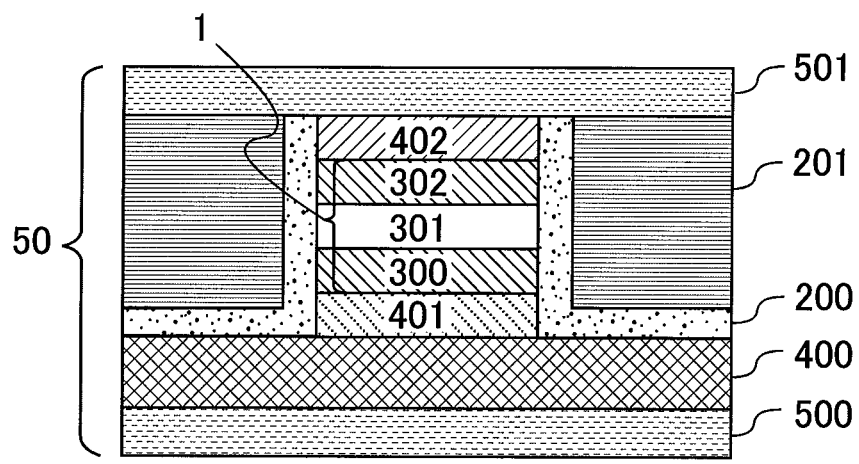
FIG. 1 is a view showing the configuration of a TMR element according a first embodiment.

FIG. 1 is a schematic cross sectional view showing the configuration of a TMR element according to a first embodiment. A TMR film 1 comprises a ferromagnetic pinned layer 300, an insulation layer 301, and a ferromagnetic free layer 302. The order of stacking the ferromagnetic pinned layer 300 and the ferromagnetic free layer 302 may be reversed. Further, CoFeB is used preferably for the ferromagnetic pinned layer 300 and the ferromagnetic free layer 302. In addition to CoFeB, material compositions of CoFe and CoFeNi, a structure comprising Co—Fe series material with addition of B, a structure comprising Ni—Fe series material with addition of B, or a configuration comprising Co—Ni—Fe series material with addition of B in the table shown in FIG. 11 may also be used. Further, as the additive element, other than B, one or plural Ta, Ru, Cu, Au, Ti, Cr, Ag, Al, Os, Re, C, O, N, Pd, Pt, Zr, Zn, Ir, W, Mo, and Nb may be used.

For the insulation layer 301, (001) oriented MgO (magnesium oxide) of a rock salt structure is used preferably and aluminum oxide (Al—O), aluminum nitride (Al—N), magnesium nitride (Mg—N), silicon oxide (Si—O), silicon nitride (Si—N), titanium oxide (Ti—O), or Ca, Ba, Sr, V, Ni, Fe, Co, Cu, Ru, Re, Os, Eu, Bi, Pb, or Zn added to MgO, Al—O, Al—N, Mg—N, Si—O, Si—N, and Ti—O, or oxides thereof may be also be used.

For controlling the crystal orientation or the crystal structure of the ferromagnetic pinned layer 300 or the ferromagnetic free layer 302, an orientation control layer 401 is formed below the tunnel magnetoresistance effect film 1, and, further, a protective film is formed over the ferromagnetic free layer 302 or the ferromagnetic pinned layer 300. For the orientation control layer 401, a material such as Ru or Ta is used. By the use of such a material, a smooth CoFeB surface can be formed at a level of atoms with good uniformity when CoFeB is used for the ferromagnetic layer and (001) orientation of MgO thereover can also be improved. As the orientation control layer, amorphous conductive materials can also be used in addition. A metal layer 400 is formed below the orientation control layer.

The most preferred material for the metal layer 400 is Ta and a metal layer having an amorphous structure, for example, TiN or CuN, TaN is preferred. By using the amorphous structure for the metal layer 400, the MgO passivation layer 200 is easily put to (001) orientation in the direction perpendicular to the film surface. An MgO passivation layer 200 is formed to cover the side wall of the TMR film 1, the orientation control layer 4001 and the protective film 402, and the side wall and the surface of the metal layer 400, and an interlayer insulation film 201 is formed so as to cover the MgO passivation layer 200. Electrodes 500 and 501 are disposed in contact with upper and lower portions of the TMR film 1 to form a TMR element.

Then, a method of writing information and reading information when the TMR element described above is applied to a magnetic memory cell or a magnetic random access memory is to be described. At first, in information writing, a voltage or a current is applied between the electrode 500 and the electrode 501, and a spin transfer torque generated from a spin current formed by flowing a current in the direction perpendicular to the film surface of the TMR film 1 is exerted on the ferromagnetic free layer 302, to reverse the magnetization direction of the ferromagnetic free layer 302, in which magnetic information is recorded as "0" when the magnetization direction of the ferromagnetic free layer 302 is in parallel to the ferromagnetic pinned layer 300 and as "1" when it is in antiparallel thereto.

Then, a tunnel magnetoresistance ratio (TMR ratio) used for reading information in the magnetization direction of the ferromagnetic free layer 302 of the TMR film 1 is to be described. For the relative angle of the magnetization direction of ferromagnetic free layer 302 and the ferromagnetic pinned layer 300, a voltage or a current is applied between the electrode 500 and the electrode 501, and it is distinguished whether the magnetization direction of the ferromagnetic free layer 302 is in parallel or antiparallel to the magnetization direction of the ferromagnetic pinned layer 300 by reading a current or a voltage generated from the TMR film 1, thereby reading information. This is referred to as a tunnel magnetoresistance effect. The tunnel magnetoresistance effect is attributable to the change of the resistance depending on the magnetization direction between each of the ferromagnetic pinned layer 300, the insulation layer 301 and the ferromagnetic free layer 302. For example, the voltage at the TMR film 1 is low (electric resistance is low and current tends to flow easily) when the magnetization direction of the ferromagnetic free layer 302 is in parallel to the magnetization direction of the ferromagnetic pinned layer 300, and the voltage is high (electric resistance is high and current less flows) when it is in antiparallel thereto.

Figure 10:
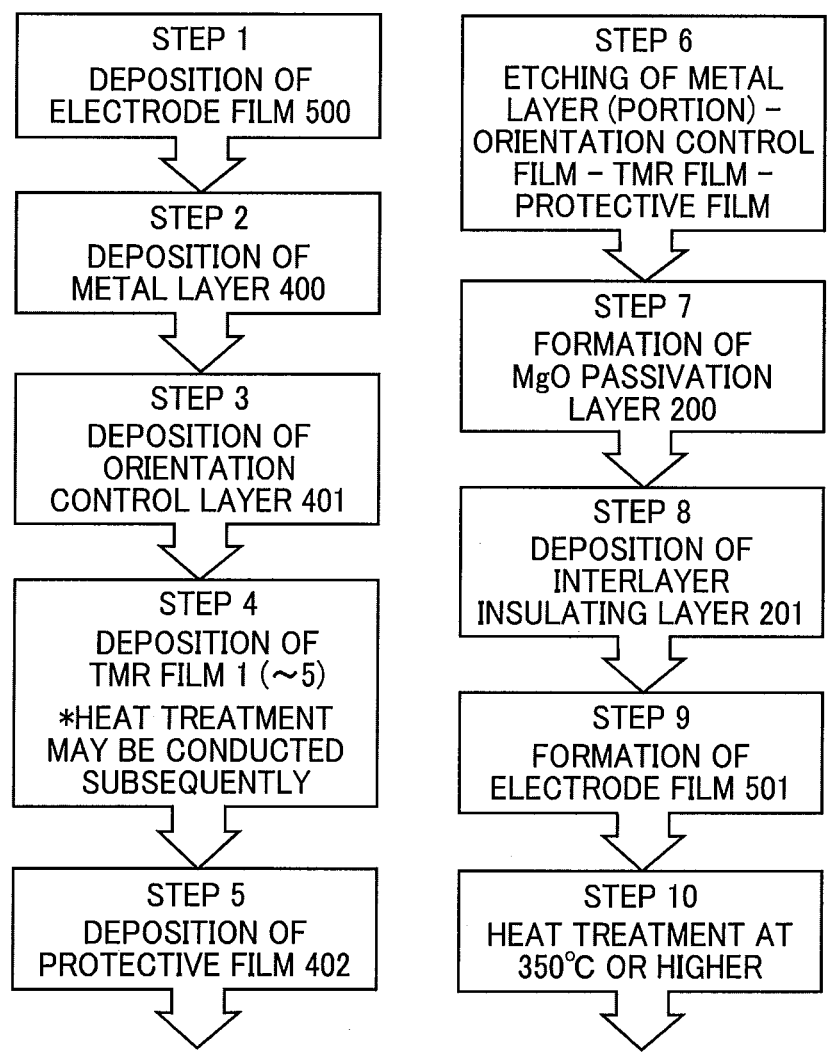
FIG. 10 is a view for explaining a manufacturing process of a TMR element according to the first embodiment.

Then, a process for manufacturing a portion of the TMR element 50 in FIG. 1 is to be described specifically with reference to FIG. 10 together with the feature of the material. A combination of CoFeB for the ferromagnetic pinned layer 300 and the ferromagnetic free layer 302 and MgO for the insulation layer 301 is to be described as a configurational example of a TMR film particularly capable of obtaining the best TMR ratio and magnetization reversal by low current spin torque.

Step (1); An electrode 500 is deposited. For the electrode 500, TiN or Ti, Al or AlCu, or Ta or Ta/Ru, etc. can be used.

Step (2); A metal layer 400 is deposited. The metal layer 400 is preferably has an amorphous structure. For example, Ta or a multilayered film of Ta/metal film/Ta, etc. can be used.

Step (3); An orientation control layer 401 is deposited. A Ta film of an amorphous structure film is used preferably for the orientation control layer.

Step (4); A tunnel magnetoresistance effect film 1 comprising the ferromagnetic pinned layer 300, the insulation layer 301, and the ferromagnetic free layer 302 is deposited. CoFeB is used for the ferromagnetic pinned layer 300 and the ferromagnetic free layer 302, and a (001) orientated MgO is used for the insulation film 301. It is a characteristic feature of this process to enable preferred (001) orientation for the MgO film of the insulation layer 301 by forming the CoFeB film in an amorphous structure for the ferromagnetic pinned layer 300 upon deposition.

Step (5); The protective film 402 is deposited. As the protective film, a film of Ru, Ta and Ta/Ru, Ta/Ru, MgO/Ta, MgO/Ta/Ru, MgO/Ru/Ta, etc. is used.

For the steps (1) to (5), it is preferably deposited in continuous stacking by using a sputtering method in vacuum without exposing from a vacuum atmosphere. Further, an entire or a portion of the layer may also be deposited by using a molecular beam epitaxy method. Since this enables to manufacture a high quality TMR element 50 since adsorption of impurities to the interface between each of the layers can be suppressed. Subsequently, a heat treatment may also be applied with an aim of improving the TMR ratio in the step (10) to be described later. The TMR ratio can be improved by applying a magnetic field in the direction horizontal to or perpendicular to the stacking direction during the heat treatment.

Step (6); They are formed into a pillar shape by performing ion milling or reactive ion etching using a resist or a metal mask of a desired size as a mask. In this step, the surface is exposed at the metal layer 400 by stopping the etching at the surface of the metal layer 400 or at a slightly deep position in the direction of the film thickness from the surface of the metal layer 400 (direction perpendicular to the film surface). The surface and the lateral side of the exposed metal layer 400 are preferably amorphous (amorphous structure). Further, while the TMR element has a 100×200 nm$^2$ planar size, a TMR element of a smaller width of 45 nm or less can be formed by the method.

Step (7); The lateral side of the pillar and the surface of the exposed metal layer 400 are covered with an MgO passivation layer 200. When the surface of the metal layer 400 is in an amorphous structure, the (001) face of the MgO passivation layer 200 is oriented easily in the direction perpendicular to the film surface.

Step (8); An interlayer insulation film 201 is formed so as to cover the MgO passivation layer 200. The interlayer insulation film 201 comprises an insulation film, for example, of SiO, SiN, AlO, AlN, etc. and deposited by CVD or the like. Further, this is sometimes formed by sputtering. Particularly, when it is deposited by CVD, a heat at 200° C. or higher is applied.

Step (9); Finally, the electrode 501 is formed. A material such as W, Al, AlCu, Ti. etc. is used for the electrode 501.

Step (10); A heat treatment at 350° C. or higher is performed. This has to be practiced with an aim of attaining the improvement in the TMR ratio of the tunnel magnetoresistance effect element 50 and the effect of reducing the current for spin torque-induced magnetic reversal to a maximum level, and for improving the yield and the improvement in the distribution of the impurity processing in the electrode and electric characteristic after forming the electrode 501. The TMR ratio can be improved by applying a magnetic field in a direction parallel to or in perpendicular to the stacking direction of the TMR film during the heat treatment. When a heat treatment at 350° C. or higher is performed to the tunnel magnetoresistance effect element 50 as described above, elements diffuse from the orientation control layer and the ferromagnetic layer. Particularly, Mn, Ru, etc. used for examples in the TMR element shown in FIG. 2 to FIG. 5 diffuse remarkably. Such elements diffuse while extending as far as the interlayer insulation layer covering the pillar to cause degradation of electric characteristic such as voltage withstanding of the interlayer insulation layer. In this case, the MgO passivation layer 200 of this embodiment has a function of suppressing the diffusion of the elements described above. Further, it is possible to reduce the effect of elemental diffusion to the heating practiced upon deposition of the interlayer insulation layer 201 in the step (8).

Figure 6:
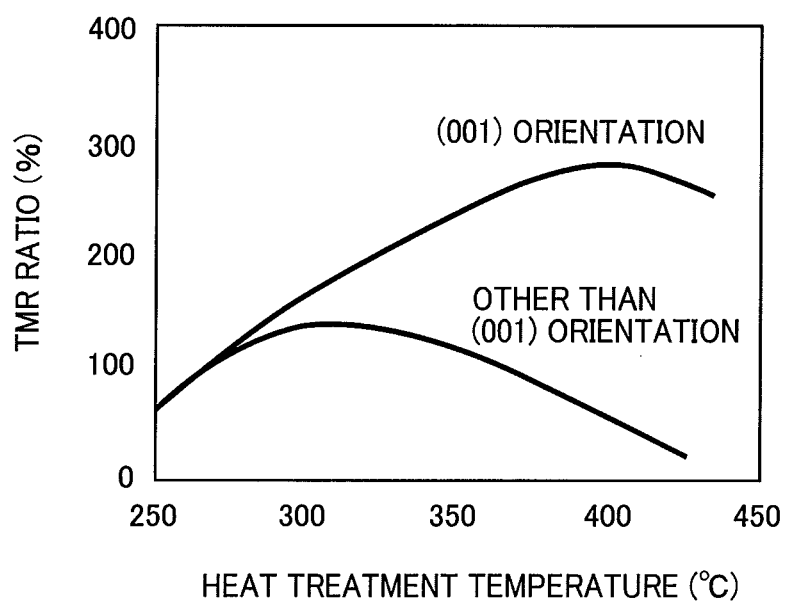
FIG. 6 is a graph showing the dependency of TMR ratio of the TMR element according to the first embodiment on the annealing temperature.

FIG. 6 shows a relation between the improvement in the TMR ratio and the crystal orientation by the heat treatment. When the TMR film 1 is formed as CoFeB/MgO/CoFeB using CoFeB for the ferromagnetic pinned layer 300 and the ferromagnetic free layer 302 and using MgO for the insulation layer 301, CoFeB which was amorphous upon deposition proceeds crystallization with the (001) oriented MgO put therebetween as a template to optimize the TMR ratio. Usually, CoFeB starts crystallization about at a temperature of 320° C. When the TMR film 1 is an entirely (001) oriented CoFeB/MgO/CoFeB also including CoFeB, the TMR ratio increases along with the heat treatment temperature and the value is at the maximum at a temperature of 400° C. or higher. However, when other crystals than those of (001) orientation are formed, the TMR ratio reaches the local maximum at a low heat treatment temperature and the TMR ratio is also reduced. Since the crystallization of CoFeB is promoted with the (001) oriented MgO insulation layer 301 as a template, the crystallization proceeds from the side wall and the crystallinity of CoFeB is made uniform by the presence of the (001) oriented MgO passivation layer at the pillar end. This enables not only to suppress element diffusion in each of the layers but also make the crystals of CoFeB uniform, thereby preventing lowering of the voltage withstanding of the interlayer insulation film and enabling improvement in the TMR ratio.

Figure 2:
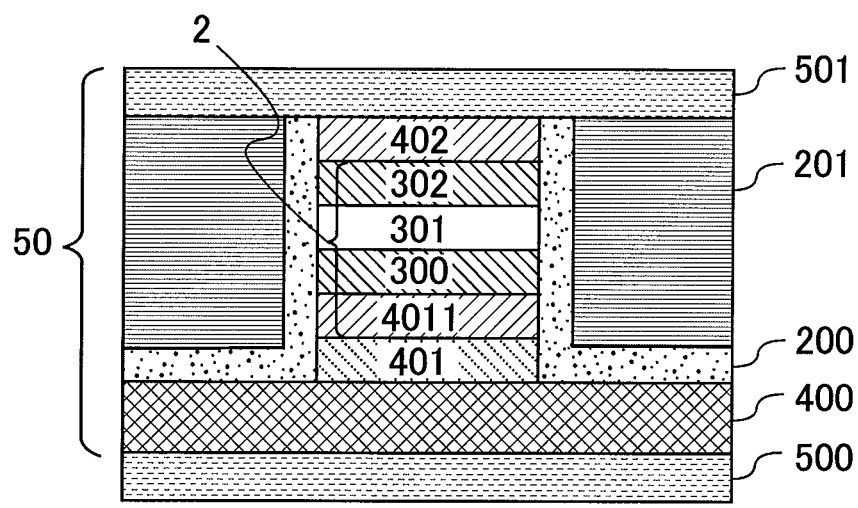
FIG. 2 is a view showing another configuration of a TMR element according to the first embodiment.

In addition to the structure of the TMR film 1 of the embodiment described above, configurations shown in FIG. 2 to FIG. 5 can also be used. FIG. 2 shows a TMR film 2 having a structure where an antiferromagnetic layer 4011 is in contact with the ferromagnetic pinned layer 300 for pinning the magnetization direction of the ferromagnetic pinned layer 300 stably in one direction. By using a material such as MnIr or MnPt for the antiferromagnetic layer 4011, a best characteristic can be obtained. Information can be read or written stably by stably pinning the magnetization direction of the ferromagnetic pinned layer 300 in one direction stably.

Figure 3:
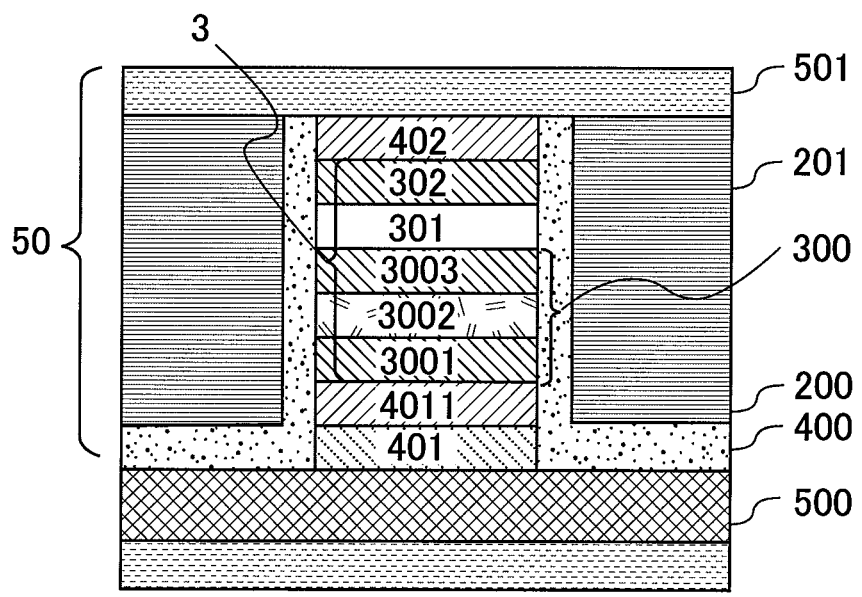
FIG. 3 is a view showing a further configuration of a TMR element according to the first embodiment.

FIG. 3 shows a configurational example of a TMR film 3 in which a ferromagnetic pinned layer 300 is a stacked ferromagnetic pinned layer formed of two layers of a ferromagnetic layer 3001 and a ferromagnetic layer 3003 where magnetization is coupled in antiparallel manner by way of a non-magnetic layer 3002 formed, for example, of Ru. With such a configuration, since the magnetization direction of the ferromagnetic pinned layer 300 can be pinned more stably in one direction than that of FIG. 2, stable reading and writing can be performed.

Figure 4:
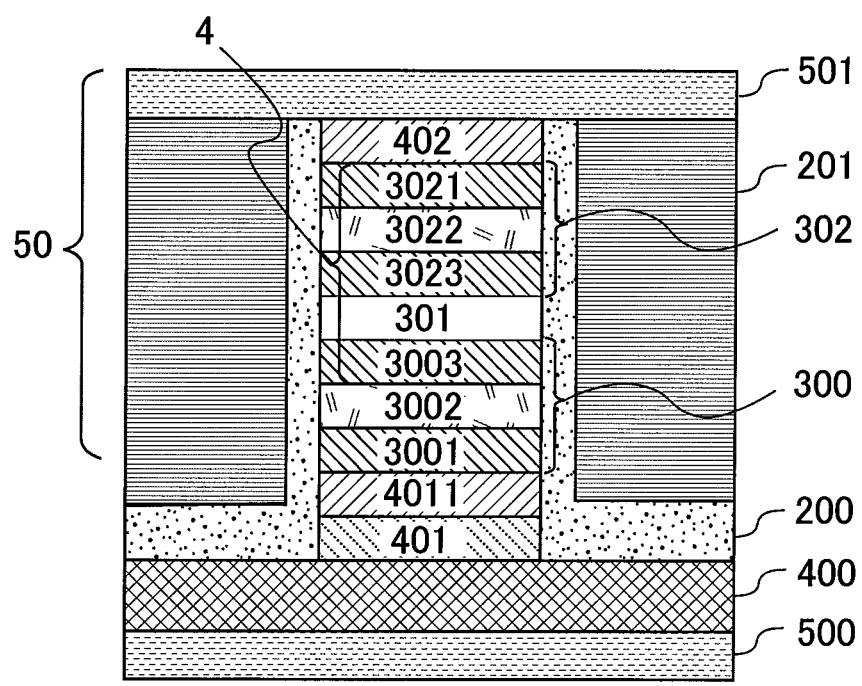
FIG. 4 is a view showing a further configuration of a TMR element according to the first embodiment.

FIG. 4 shows an example of a TMR film 4 in which a ferromagnetic free layer 302 is a stacked ferromagnetic free layer formed of two layers of a ferromagnetic layer 3021 and a ferromagnetic layer 3023 where magnetization is coupled in an antiparallel manner by way of a non-magnetic layer 3022. By using the stacked ferromagnetic free layer for the ferromagnetic free layer, low current information writing at a current density of 1 MA/cm$^2$ or less can be attained and information recording can be held for 10 years or more.

Figure 5:
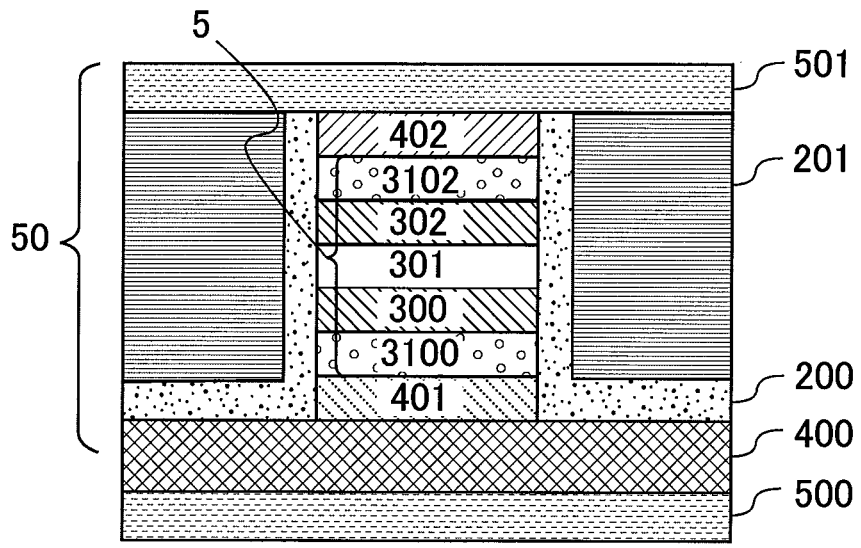
FIG. 5 is a view showing a further configuration of a TMR element according to the first embodiment.

FIG. 5 shows a TMR film 5 having a structure in which each of a ferromagnetic pinned layer 300 and a ferromagnetic free layer 302 has two or more of ferromagnetic layers. This embodiment shows a configurational example where a ferromagnetic pinned layer comprises two layers of a ferromagnetic pinned layer 300 and a ferromagnetic layer 3100, and a ferromagnetic free layer comprises two layers of a ferromagnetic free layer 302 and a ferromagnetic free layer 3102. For the ferromagnetic layer 3100 and the ferromagnetic layer 3102, vertically magnetized films where the magnetization thereof is in a direction perpendicular to the film surface can be used. By using CoFeB for the ferromagnetic pinned layer 300 and the ferromagnetic free layer 302 in contact with the insulation layer 301 and disposing a vertically magnetized film for the ferromagnetic layer 3100 and the ferromagnetic layer 3102, the magnetization direction of CoFeB is induced to the vertical direction. With such a structure, information record holding for 10 years is further stabilized.

For the ferromagnetic layers 3100 and 3102, materials such as TbFeCo, GdFeCo, CoPt, FePt, CoFeBPt, CoFeBCr, CoCrPt, CoCr, CoPtB, FePtB, CoGd, CoFeBCr, etc. can be used. Further, it is possible to use, for example, a Co/Pt multilayered film, a CoFe/Pt multilayered film, a Fe/Pt multilayered film, a Co/Pd multilayered film can be used.

Embodiment 2

Figure 7:
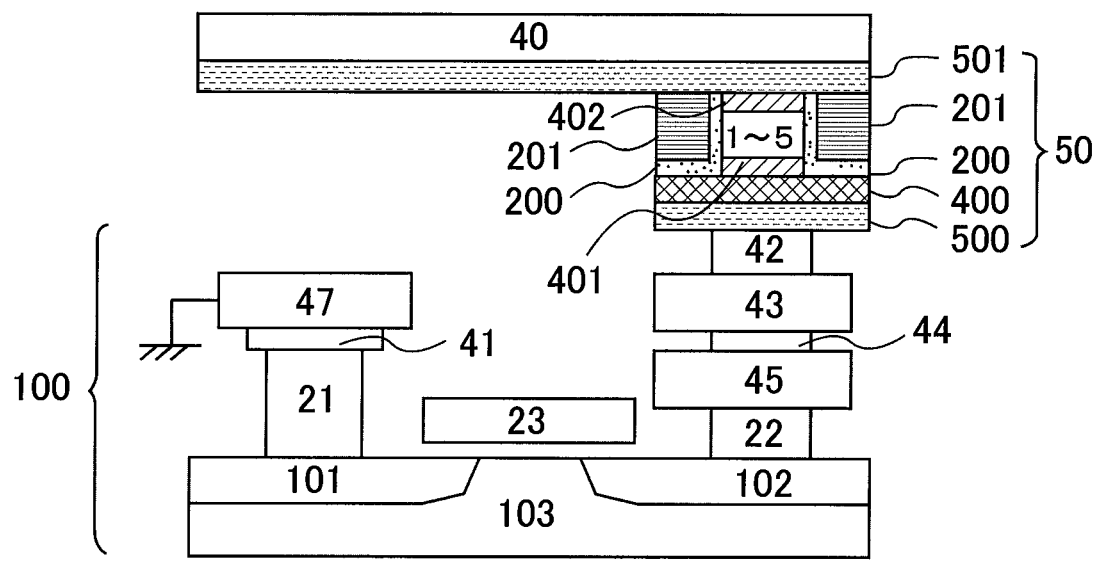
FIG. 7 is a view showing a configurational example of a magnetic memory cell according to a second embodiment.
Figure 8:
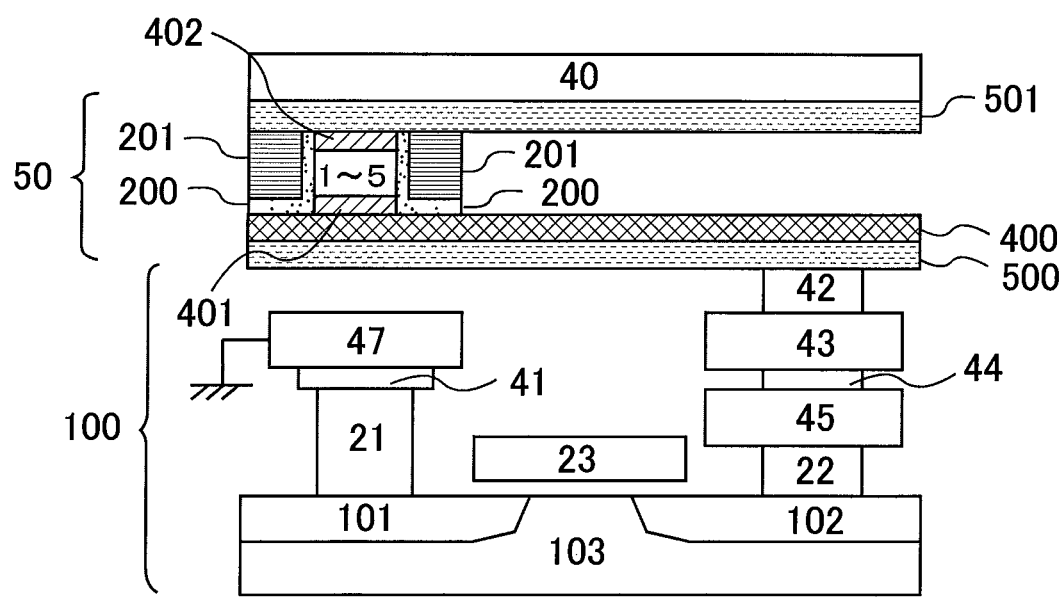
FIG. 8 is a view showing another configurational example of a magnetic memory cell according to the second embodiment.

FIG. 7 and FIG. 8 are schematic cross sectional views showing a configurational example of a magnetic memory cell as a second embodiment. In the drawing, the TMR element shown in FIG. 1 to FIG. 5 is mounted at a portion shown as a TMR element 50 in the drawing.

C-MOS 100 comprises two n-type semiconductors 101 and 102 and one p-type semiconductor 103. An electrode 21 as a drain is electrically connected to an n-type semiconductor 101 and connected to the ground by way of an electrode 41 and an electrode 47. An electrode 22 as a source is electrically connected to an n-type semiconductor 102. Further, 23 denotes a gate electrode and ON/OFF of the current between the source electrode 22 and the drain electrode 21 is controlled by ON/OFF of the gate electrode 23. Over the source electrode 22, an electrode 45, an electrode 44, an electrode 43, an electrode 42, and an electrode 500 are stacked and a tunnel magnetoresistance effect film 1 to 5 comprising one of the structures in FIG. 1 to FIG. 5 is connected by way of the metal layer 400. An orientation control layer 401 is formed between the TMR film 1 to 5 and the metal layer 400. A protective layer 402 is stacked over the TMR film 1 to 5 and, further, an electrode 501 is formed in contact with the protective layer 402. An interconnect 40 is formed over the electrode 501 and the stacked interconnect of the electrode 501 and the interconnect 400 can form a bit line. Further, the interconnect 40 alone can also constitute the bit line. FIG. 7 shows an example in which a TMR element 50 is formed just over the electrode 42 and FIG. 8 shows an example in which the TMR element 50 is formed by extending the electrode 50 and the metal layer 400 from the electrode 42. In these cases, while the MgO passivation 200 is formed so as to cover at least the side walls of the TMR film 1 to 5, alignment control layer 401, and the protective layer 402, it may be formed so as to cover the metal layer 400. The interlayer insulation film 201 is preferably formed so as to cover the MgO passivation.

In the memory cell of the embodiment described above, the magnetization direction of the ferromagnetic free layer 302 of the tunnel magnetoresistance effect film 1 to 5 is rotated by a current flowing to the tunnel magnetic resistance effect film 1 to 5, so-called spin transfer torque, thereby recording the magnetic information. The spin transfer torque is based on the principle that a torque is given to the magnetic moment of ferromagnetic free layer 302 of TMR film 1 to 5 not by a spatial external magnetic field, but mainly by the spin of the spin-polarized current flowing in the TMR element. The spin-polarized current has a mechanism of generating by flowing a current to the TMR film 1 to 5. Accordingly, magnetization reversal by the spin transfer torque is realized by providing means for supplying a current from the outside to the TMR film 1 to 5 and flowing the current from the means. In this embodiment, the spin transfer torque is exerted on the ferromagnetic free layer 302 in the TMR film 1 to 5 by the flow of the current between the bit line comprising the interconnect 40 and the electrode 501 or the interconnect 40 solely and the electrode 47. When writing is performed by spin transfer torque, the power during writing can be decreased to about $\frac{1}{100}$ compared with the case of using a current magnetic field.

Figure 9:
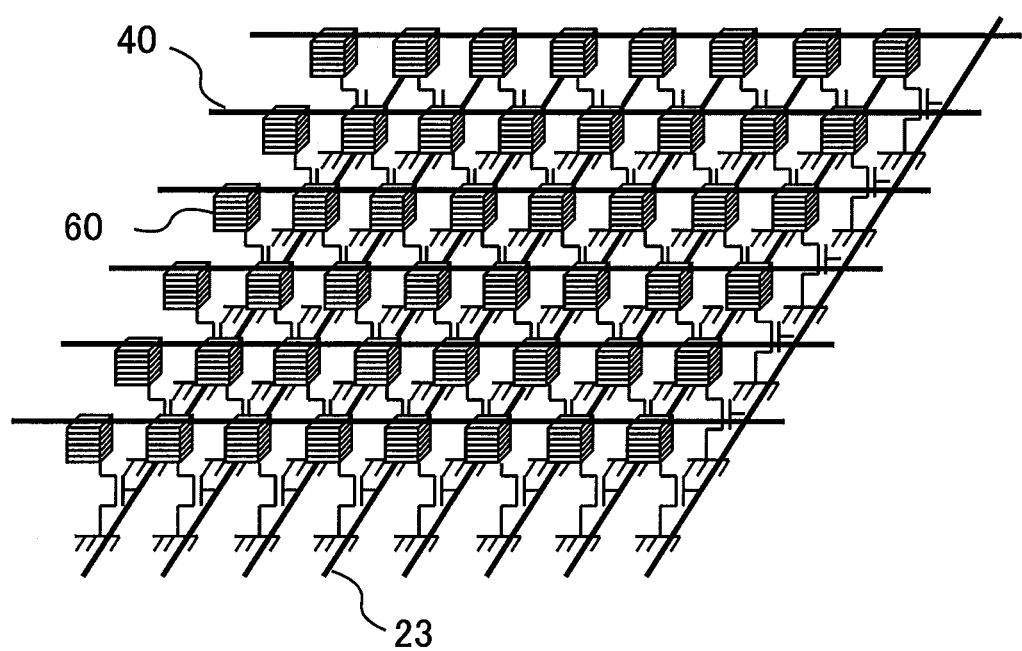
FIG. 9 is a view showing a configurational example of a magnetic random access memory using a magnetic memory cell according to the second embodiment.

FIG. 9 is a view showing a configurational example of a magnetic random access memory in which the magnetic memory cells described above are arranged. Gate electrodes 23 forming a selection section for selecting an optional magnetic memory in the random access memory and interconnects 40 as the bit line are connected electrically to each of the magnetic memory cells 60. By disposing the magnetic memory cells described specifically above, operation is enabled at low consumption power and a high density magnetic memory at a giga bit class can be realized.

INDUSTRIAL APPLICABILITY

The present invention is extremely useful as a tunnel magnetoresistance element, and as a low power consumption non-volatile magnetic memory provided with the same.

REFERENCE SIGNS LIST 1 to 5 tunnel magnetoresistance effect film,
100 transistor,
101 first n-type semiconductor,
102 second n-type semiconductor,
103 p-type semiconductor,
21 source electrode,
22 drain electrode,
23 gate electrode,
200 MgO passivation layer,
201 interlayer insulation film,
300 ferromagnetic pinned layer,
301 insulation layer,
302 ferromagnetic free layer,
3001 ferromagnetic layer,
3002 non-magnetic layer,
3003 ferromagnetic layer,
3021 ferromagnetic layer,
3022 non-magnetic layer,
3023 ferromagnetic layer,
40 interconnect (bit line),
400 metal layer,
401 orientation control layer,
4011 antiferromagnetic layer,
402 protective layer,
41 electrode interconnect,
42 electrode interconnect,
43 electrode interconnect,
44 electrode interconnect,
45 electrode interconnect,
47 electrode interconnect,
50 tunnel magnetoresistance effect element,
500 electrode,
501 electrode,
60 magnetic memory cell

The invention claimed is:

1. A magnetoresistance effect element comprising;
an amorphous non-magnetic metal layer,
an orientation control layer formed over the non-magnetic metal layer,
a tunnel magnetoresistance effect element formed above the orientation control layer and including a ferromagnetic free layer, a ferromagnetic pinned layer, and an insulation layer formed between the ferromagnetic free layer and the ferromagnetic pinned layer,
a magnesium oxide passivation layer for covering the side wall of the tunnel magnetoresistance effect element, the side wall of the orientation control layer, and the side wall and the surface of the non-magnetic metal layer,
an interlayer insulation layer for covering the magnesium oxide passivation layer, and
a pair of electrode layers for flowing a current in a direction perpendicular to the film surface of the tunnel magnetoresistance effect element,
wherein the insulation layer comprises a (001) oriented magnesium oxide, and
wherein the magnesium oxide passivation layer has a (001) crystal face in a direction perpendicular to the film surface.

2. A magnetoresistance effect element according to claim 1, wherein
the ferromagnetic free layer and the ferromagnetic pinned layer are formed of a film containing at least one of Co, Fe, Ni, and B.

3. A magnetoresistance effect element according to claim 1, wherein
the ferromagnetic free layer and the ferromagnetic pinned layer are each formed of a ferromagnetic layer of a body-centered cubic lattice containing at least one of Co, Fe, Ni, and B.

4. A magnetoresistance effect element according to claim 1, wherein
magnetization of the ferromagnetic free layer is reversed by a spin transfer torque, and the magnetization direction of the ferromagnetic free layer to the magnetization direction of the ferromagnetic pinned layer is detected by the tunnel magnetoresistance effect.

5. A magnetoresistance effect element according to claim 1, wherein
an antiferromagnetic layer for pinning the magnetization direction of the ferromagnetic pinned layer is further provided.

6. A magnetoresistance effect element according to claim 1, wherein
the ferromagnetic pinned layer comprises a first ferromagnetic layer and a second ferromagnetic layer coupled in an antiparallel manner in the magnetization direction while putting the non-magnetic layer therebetween.

7. A magnetoresistance effect element according to claim 1, wherein
the ferromagnetic free layer comprises a first ferromagnetic layer and a second ferromagnetic layer coupled in an antiparallel manner in the magnetization direction while putting the non-magnetic layer therebetween.

8. A magnetoresistance effect element according to claim 1, wherein
the ferromagnetic free layer and the ferromagnetic pinned layer are each formed of two or more ferromagnetic layers.

9. A magnetoresistance effect element according to claim 7, wherein
the magnetization direction of at least one of the ferromagnetic free layer and the ferromagnetic pinned layer is in a direction perpendicular to the film surface.

10. A magnetic memory cell comprising;
an amorphous non-magnetic metal layer,
an orientation control layer formed over the non-magnetic metal layer,
a tunnel magnetoresistance effect element formed over the orientation control layer and including a ferromagnetic free layer, a ferromagnetic pinned layer, and an insulation layer formed between the ferromagnetic free layer and the ferromagnetic pinned layer,
a magnesium oxide passivation layer for covering the side wall of the tunnel magnetoresistance effect element, the side wall of the orientation control layer and the side wall and the surface of the non-magnetic metal layer,
an interlayer insulation layer for covering the magnesium oxide passivation layer,
a pair of electrodes for flowing a current in a direction perpendicular to the film surface of the tunnel magnetoresistance effect element, and
a switching element for on-off control of the current flowing to the tunnel magnetoresistance effect element,
wherein the insulation layer comprises a (001) oriented magnesium oxide and
wherein the magnesium oxide passivation layer has a (001) crystal face in a direction perpendicular to the film surface.

11. A magnetic memory cell according to claim 10, wherein
the magnetization of the ferromagnetic free layer is reversed by a spin transfer torque, and the magnetization direction of the ferromagnetic free layer to the magnetization direction of the ferromagnetic pinned layer is detected by the tunnel magnetoresistance effect.

12. A magnetic memory cell according to claim 10, wherein
the ferromagnetic free layer and the ferromagnetic pinned layer are each formed of a film containing at least one of Co, Fe, Ni, and B.

13. A magnetic memory cell according to claim 10, wherein
the ferromagnetic free layer and the ferromagnetic pinned layer are each formed of a ferromagnetic layer of a body-centered cubic lattice containing at least one of Co, Fe, Ni, and B.

14. A magnetic random access memory comprising;
a group of memory cells where magnetic memory cells each having a switching element for on-off control of a current flowing to a magnetoresistance effect element are arranged in a 2-dimensional array, and
a selection section for selecting a desired magnetic memory cell in the group of memory cells in which,
the magnetoresistance effect element includes
an amorphous non-magnetic metal layer,
an orientation control layer formed over the non-magnetic metal layer,
a tunnel magnetoresistance effect element formed above the orientation control layer and including a ferromagnetic free layer, a ferromagnetic pinned layer, and an insulation layer formed between the ferromagnetic free layer and the ferromagnetic pinned layer,
a magnesium oxide passivation layer for covering the side wall of the tunnel magnetoresistance effect element, the side wall of the orientation control layer, and the side wall and the surface of the non-magnetic metal layer,
an interlayer insulation layer for covering the magnesium oxide passivation layer, and a pair of electrode layer for flowing a current in a direction perpendicular to the film surface of the tunnel magnetoresistance effect element,
wherein the insulation layer comprises a (001) oriented magnesium oxide, and
wherein the magnesium oxide passivation layer has a (001) crystal face in a direction perpendicular to the film surface.

15. A magnetic random access memory according to claim 14, wherein
a current is supplied to the magnetoresistance effect element of the magnetic memory cell selected by the selection section, and the magnetization of the ferromagnetic free layer is reversed by a spin transfer torque, thereby writing information.

16. A magnetic random access memory according to claim 14, wherein
the ferromagnetic free layer and the ferromagnetic pinned layer are each formed of a film containing at least one of Co, Fe, Ni, and B.

17. A magnetic random access memory according to claim 14, wherein
the ferromagnetic free layer and the ferromagnetic pinned layer are each formed of a ferromagnetic layer of a body-centered cubic lattice containing at least one of Co, Fe, Ni, and B.

* * * * *